United States Patent
Matsuda et al.

(10) Patent No.: US 7,188,287 B2
(45) Date of Patent: Mar. 6, 2007

(54) SEMICONDUCTOR APPARATUS

(75) Inventors: Genichiro Matsuda, Osaka (JP);
Akimitsu Shimamura, Osaka (JP);
Gen Fukatsu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 352 days.

(21) Appl. No.: 10/822,724

(22) Filed: Apr. 13, 2004

(65) Prior Publication Data
US 2004/0216021 A1     Oct. 28, 2004

(30) Foreign Application Priority Data
Apr. 24, 2003   (JP)   ............ P2003-119923

(51) Int. Cl.
*G01R 31/28* (2006.01)
(52) U.S. Cl. ................ 714/728; 714/726
(58) Field of Classification Search ........... None
See application file for complete search history.

(56) References Cited

U.S. PATENT DOCUMENTS

| | | | |
|---|---|---|---|
| 4,910,735 A | 3/1990 | Yamashita | |
| 5,157,781 A * | 10/1992 | Harwood et al. | ............ 714/30 |
| 5,349,636 A | 9/1994 | Irribarren | |
| 5,400,393 A | 3/1995 | Knuth et al. | |
| 5,406,618 A | 4/1995 | Knuth et al. | |
| 5,604,791 A | 2/1997 | Lee | |
| 5,651,123 A | 7/1997 | Nakagawa et al. | |
| 5,654,972 A | 8/1997 | Kuroiwa et al. | |
| 5,832,062 A | 11/1998 | Drake | |
| 5,949,852 A | 9/1999 | Duncan | |
| 6,014,559 A | 1/2000 | Amin | |
| 6,061,718 A | 5/2000 | Nelson | |
| 6,097,941 A | 8/2000 | Helferich | |
| 6,104,788 A | 8/2000 | Shaffer et al. | |
| 6,115,763 A * | 9/2000 | Douskey et al. | ............ 710/72 |
| 6,249,892 B1 | 6/2001 | Rajsuman et al. | |
| 6,346,822 B2 | 2/2002 | Nishikawa | |
| 6,353,659 B1 | 3/2002 | Van Ryzin et al. | |
| 6,483,695 B1 | 11/2002 | Hartstein | |
| 2001/0036264 A1 | 11/2001 | Ito et al. | |

* cited by examiner

*Primary Examiner*—Phung My Chung
(74) *Attorney, Agent, or Firm*—McDermott Will & Emery LLP

(57) ABSTRACT

A semiconductor apparatus comprises a processor having an instruction register inside thereof, a pseudorandom number generating device activated in response to a test operation and generating pseudorandom numbers, an input switchover device for switching over between data input in normal operation and input of the pseudorandom numbers from the pseudorandom number generating device in the test operation to thereby output the data or pseudorandom numbers to the instruction register. The pseudorandom numbers generated in the pseudorandom number generating device are inputted to the instruction register via the input switchover device so that the random instructions are implemented and a random test is implemented with an activation rate equivalent to the same in the normal operation.

2 Claims, 8 Drawing Sheets

F I G. 1
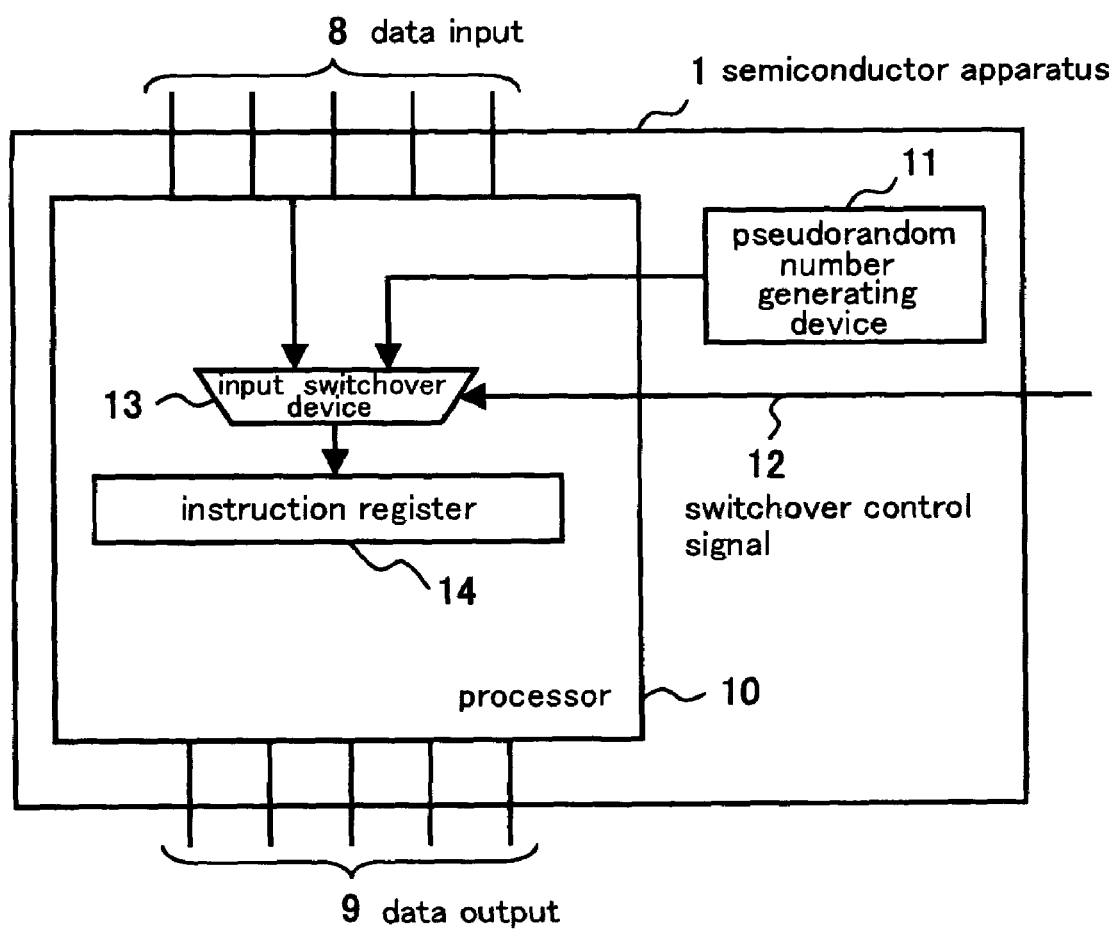

F I G. 5
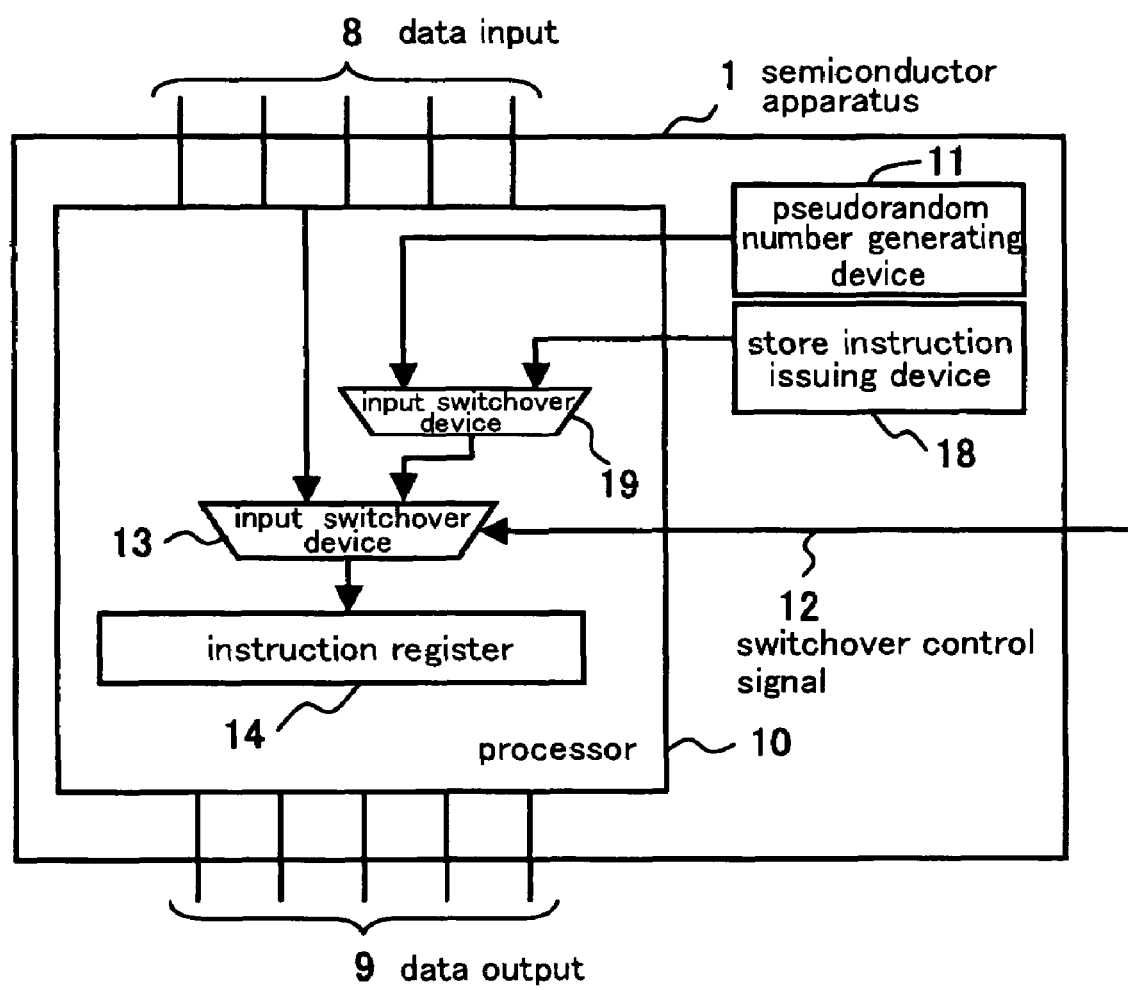

SEMICONDUCTOR APPARATUS

BACKGROUND OF THE INVENTION

The present invention relates to a testing technology in the manufacturing process of a semiconductor apparatus.

General tests conducted in the manufacturing process of a semiconductor apparatus are described referring to FIG. 8.

A functional test and a scan test are conducted in the manufacturing process of the semiconductor apparatus.

The functional test is a test method in which a test vector is provided for a data input 8, logic calculation is exercised in combining circuits 3, 4 and 5, and a data output 9, which is the result of the logic calculation, is compared to an expected value, thereby detecting faults.

In contrast to that, in the scan test, flip-flops are randomly combined by means of scan chains independently from normal operation. In scan test mode, test data is shift inputted from a scan input 6, and values are set in the respective flip-flops. After the setting, clocks are input in normal operation mode, and a combining circuit sandwiched by the flip-flops in front and behind thereof is tested. Again in the scan test mode, the data is shift outputted from a scan output 7 to be compared to the expected value, thereby detecting faults in the combining circuit.

However, in the described testing methods, it is difficult to achieve compatibility between the fault detection with a high fault detection rate and the fault detection at the actual operating speed because of the following two reasons.

Reason 1

The implementation of the functional test covers a variety of statuses subject to interinstruction dependences and dependences resulting from different data combinations, and further, timings at which interruptions, exception processing and the like are combined. It is, however, actually difficult to test all the described statuses in terms of creating test patterns and also implementing such tests. In brief, there is a limit to the improvement of the fault detection rate.

Reason 2

The scan test is generally implemented at a speed lower than the actual operating speed, which precludes the possibility of detecting delay faults. Hypothetically, when the scan test is implemented at the actual operating speed, the toggle rate of the flip-flops (activation rate) becomes unimaginably large compared to the same in the normal operation allowing excessive current flow because all of the flip-flops are randomly combined. The excessive electric flow causes significant reduction of a power-supply voltage (IR-Drop), which subsequently causes a lowered speed of a transistor making it difficult to detect the delay faults. As a result, the delay fault detection cannot be implemented at the actual operating speed in the scan test.

SUMMARY OF THE INVENTION

Therefore, a main object of the present invention is to provide a semiconductor apparatus capable of satisfying both fault detection with a high fault detection rate and fault detection at an actual operating speed.

The foregoing and other aspects of the present invention will become apparent from the following description of the invention.

In order to solve the described problems, the present invention implements the following measures. Hereinafter are described plural types of measures for components, in which the components may be comprised of hardware or software, or combination of hardware and software.

1. The semiconductor apparatus according to the present invention comprises:
   a processor having an instruction register inside thereof;
   a pseudorandom number generating device,
   the pseudorandom number generating device activated in response to a test operation and generating pseudorandom numbers; and
   an input switchover device,
   the input switchover device switching over between data input in normal operation and input of the pseudorandom numbers from the pseudorandom number generating device in the test operation to thereby output the data or pseudorandom numbers to the instruction register.

More specifically, the apparatus is configured in such manner that the pseudorandom number generating device is connected to the instruction register via the input switchover device in the test operation so that the pseudorandom numbers from the pseudorandom number generating device are inputted to the instruction register.

According to the foregoing configuration, the pseudorandom numbers are used as instruction codes so that instructions are randomly implemented, thereby achieving a high fault detection rate. Further, the activation rate of memory elements in flip-flops sandwiching a combining circuit in front and behind thereof can be at a level equivalent to the same in the normal operation.

Therefore, the foregoing configuration satisfies the fault detection with a high fault detection rate and the fault detection at the actual operating speed.

2. In the case of implementing the instructions using the pseudorandom numbers in the measure 1, when the pseudorandom numbers are the instructions that are not defined (undefined instructions), the processor implements exception processing, which requires a longer testing time. Therefore, the apparatus is configured in such manner that, when the pseudorandom numbers are the undefined instructions, they are first converted into the instructions that are defined (defined instructions) and then inputted to the instruction register via the input switchover device.

More specifically, in the measure 1, the configuration of the apparatus further comprises an instruction converting device between the pseudorandom number generating device and input switchover device. By means of the instruction converting device, when the pseudorandom numbers inputted from the pseudorandom number generating device are the defined instructions, the pseudorandom numbers are outputted without change, and when the pseudorandom numbers are the undefined instructions, they are converted into the defined instructions and outputted.

According to the foregoing configuration, in the test operation, the pseudorandom numbers from the pseudorandom number generating device are guided to the instruction converting device and, when the pseudorandom numbers are the undefined instructions, they are converted into the defined instructions and inputted to the instruction register via the input switchover device. In this manner, when the pseudorandom numbers are used as the instruction codes, the generated pseudorandom numbers, in the case of being the undefined instructions, are converted into the defined instructions. It thereby becomes unnecessary for the processor to implement the exception processing. Thus, the activation rate of the memory elements disposed in front and behind of the combining circuit can be at a level equivalent to the same in the normal operation. Therefore, the fault detection with a high fault detection rate and the fault detection at the actual operating speed can be both achieved.

3. The semiconductor apparatus according to the present invention comprises:

a processor, the processor having, inside thereof, an instruction register and a difficult-to-control circuit part difficult to control by merely setting the pseudorandom numbers in the instruction register;

a pseudorandom number generating device, the pseudorandom number generating device activated in response to the test operation and generating pseudorandom numbers;

an input switchover device, the input switchover device switching over between data input in the normal operation and input of the pseudorandom numbers from the pseudorandom number generating device in the test operation to thereby output the data or pseudorandom numbers to the instruction register; and a scan shift controlling device, the scan shift controlling device scan inputting the pseudorandom numbers from the pseudorandom number generating device to the difficult-to-control circuit part and scan outputting data from the difficult-to-control circuit part in the test operation.

More specifically, the apparatus is configured in such manner that the pseudorandom numbers from the pseudorandom number generating device are inputted by means of scan shift to the difficult-to-control circuit part difficult to control by merely setting the pseudorandom numbers in the instruction register, and the data result is outputted by means of the scan shift.

In the processor including a circuit part controllable by means of random instructions and another circuit part difficult to control by means of the random instructions, the described measure 1 is adopted to the controllable circuit part and the scan shift is implemented to the difficult-to-control circuit part.

The foregoing configuration, as a result, enables the control and observation of the difficult-to-control circuit part, and further, the activation rate of the memory elements disposed in front and behind of the combining circuit can be at a level equivalent to the same in the normal operation. Therefore, the fault detection with a high fault detection rate and the fault detection at the actual operating speed can be both achieved.

4. Also in the measure 3, when the instructions are implemented using the pseudorandom numbers which are the undefined instructions, the processor is required to implement the exception processing resulting in a longer testing time. Therefore, the apparatus is configured in such manner that, when the pseudorandom numbers are the undefined instructions, they are converted into the defined instructions and inputted to the instruction register via the input switchover device.

More specifically, in the measure 3, the configuration of the apparatus further comprises an instruction converting device between the pseudorandom number generating device and input switchover device. By means of the instruction converting device, when the pseudorandom numbers input from the pseudorandom number generating device are the defined instructions, the pseudorandom numbers are outputted without change, and when the pseudorandom numbers are the undefined instructions, they are converted into the defined instructions and outputted.

In the foregoing configuration, the pseudorandom numbers from the pseudorandom number generating device are guided to the instruction converting device, and, when the pseudorandom numbers are the undefined instructions, they are converted into the defined instructions and inputted to the instruction register via the input switchover device in the test operation. In this manner, when the pseudorandom numbers are used as the instruction codes, the generated pseudorandom numbers, in the case of being the undefined instructions, are converted into the defined instructions. It thereby becomes unnecessary for the processor to implement the exception processing.

Further, in the processor including a circuit part controllable by means of the random instructions and another circuit difficult to control by means of the random instructions, the described measure 3 is adopted to the controllable circuit part and the scan shift is implemented to the difficult-to-control circuit part.

The foregoing configuration, as a result, enables the control and observation of the difficult-to-control circuit part, and further, the activation rate of the memory elements disposed in front and behind of the combining circuit can be at a level equivalent to the same in the normal operation. Therefore, the fault detection with a high fault detection rate and the fault detection at the actual operating speed can be both achieved.

5. The semiconductor apparatus according to the present invention comprises:

a processor having an instruction register inside thereof;

a pseudorandom number generating device, the pseudorandom number generating device activated in response to the test operation and generating pseudorandom numbers;

a store instruction issuing device, the store instruction issuing device periodically issuing store instructions for outside from the internal register;

a front input switchover device, the front input switchover device switching over between the pseudorandom numbers from the pseudorandom number generating device and the store instructions from the store instruction issuing device to thereby output the pseudorandom numbers or store instructions in the test operation; and a rear input switchover device switching over between data input in the normal operation and input from the front input switchover device in the test operation to thereby output the data or the input from the front input switchover device to the instruction register.

More specifically, the apparatus is configured in such manner that, when the pseudorandom numbers from the pseudorandom number generating device are inputted to the instruction register to thereby conduct a manufacturing test, the contents of the internal register are periodically stored. According to the foregoing configuration, when a random test using the pseudorandom numbers is conducted, the contents of the internal register are periodically stored. In this manner, without using a high-function tester, the activation rate of the memory elements disposed in front and behind of the combining circuit can be at a level equivalent to the same in the normal operation, and further, the internal register can be observed. Therefore, the fault detection with a high fault detection rate and the fault detection at the actual operating speed can be both achieved.

6. The semiconductor apparatus according to the present invention comprises:

a processor having an instruction register inside thereof;

a pseudorandom number/store instruction issuing device, the pseudorandom number/store instruction issuing device activated in response to the test operation and switching over between the pseudorandom numbers and store instructions for outside from the internal register to thereby issue the pseudorandom numbers or store instructions; and an input switchover device, the input switchover device switching over between data input in the normal operation and input from the pseudorandom number/store instruction issuing device in the test operation to thereby output the data or the input from the front input switchover device to the instruction register.

In this configuration, the pseudorandom number generating device, store instruction issuing device and front input switchover device in the measure 5 are combined into one device to configure the pseudorandom number/store instruction issuing device.

This realizes an apparatus capable of exerting a function equivalent to the same in the measure 5 with a simpler configuration.

7. In the measure 6, when a plurality of registers are comprised, it is accordingly necessary to implement the store instructions plural times in order to store the contents of the respective internal registers, which requires a longer testing time. As a solution, the configuration in the measure 6 further comprises a data compressing device on the output side of the internal registers. By means of the data compressing device, values in the internal register are compressed and data resulting from the compression is outputted to outside when the store instructions are implemented.

The data compressing device compresses the values in the plural internal registers, and the compressed values in the internal registers can be stored in response to one store instruction. As a result, the activation rate of the memory elements disposed in front and behind of the combining circuit can be at a level equivalent to the same in the normal operation, and further, the internal registers can be observed. Therefore, the fault detection with a high fault detection rate and the fault detection at the actual operating speed can be both achieved.

As is clear from the foregoing description, the components of the apparatus, which are the pseudorandom number generating device, input switchover device, instruction converting device, scan shift controlling device, store instruction issuing device, and pseudorandom number/store instruction issuing device, may be comprised of hardware or software in part or in whole.

The foregoing and other aspects of the present invention will become apparent from the following description of the invention when considered in conjunction with the accompanying drawing figures.

BRIEF DESCRIPTION OF THE DRAWINGS

FIG. 1 is a block diagram illustrating the configuration of a semiconductor apparatus according to Embodiment 1 of the present invention.

FIG. 5 is a block diagram illustrating the configuration of a semiconductor apparatus according to Embodiment 5 of the present invention.

In all these figures, like components are indicated by the same numerals

DETAILED DESCRIPTION

Figure 2:
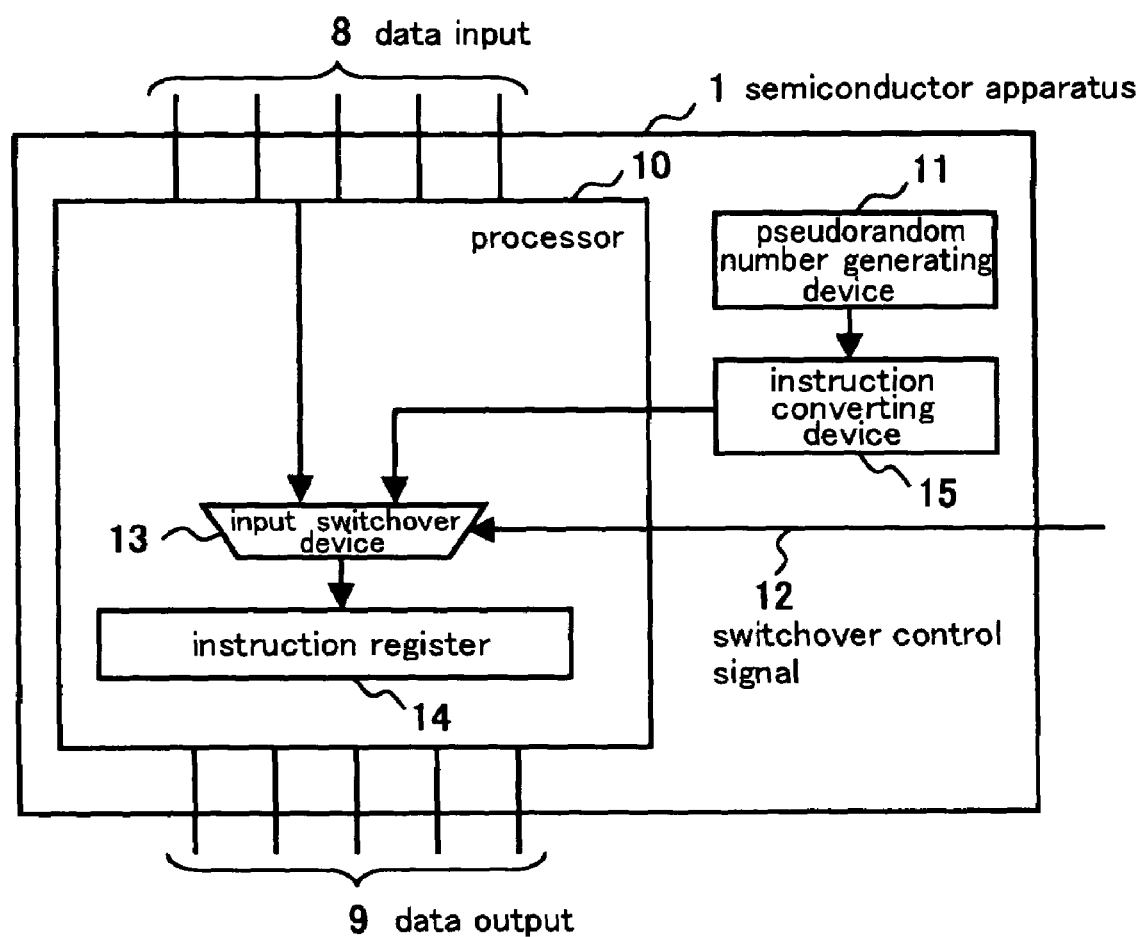
FIG. 2 is a block diagram illustrating the configuration of a semiconductor apparatus according to Embodiment 2 of the present invention.

Hereinafter are described preferred embodiments of the present invention relating to a semiconductor apparatus referring to the drawings.

Embodiment 1

The semiconductor apparatus according to Embodiment 1 of the present invention is described referring to FIG. 1.

In FIG. 1, a numeral 1 is a semiconductor apparatus, a numeral 10 is a processor, a numeral 8 is data input to the processor 10, a numeral 9 is data output from the processor 10, a numeral 11 is a pseudorandom number generating device as a novel component, and a numeral 14 is an instruction register inside of the processor 10. A numeral 13 is an input switchover device for selecting the data input 8 in normal operation and selecting pseudorandom numbers outputted from the pseudorandom number generating device 11 in a test operation to thereby output the data or pseudorandom numbers to the instruction register 14. A numeral 12 is a switchover control signal for controlling the switchover of the inputs by the input switchover device 13. The input switchover device 13 is, for example, comprised of a selector.

A test conducted in the manufacturing process of the semiconductor apparatus according to the foregoing configuration is described below.

In the test conducted in the manufacturing process, the input switchover device 13 is controlled by means of the switchover control signal 12 so that the pseudorandom numbers generated in the pseudorandom number generating device 11 are directly inputted to the instruction register 14. The processor 10 operates the pseudorandom numbers inputted to the instruction register 14 as the instruction codes and implements the data output 9. The data output 9 is compared to an expected value.

According to this embodiment, because the instructions implemented by the processor 10 stand on the pseudorandom numbers, the test in the manufacturing process can be implemented with an activation rate equivalent to the same in the normal operation. A high fault detection rate can be thus easily achieved.

Embodiment 2

The semiconductor apparatus according to Embodiment 2 of the present invention is described referring to FIG. 2.

In FIG. 2, a numeral 15 is an instruction converting device as a novel component. The instruction converting device 15 is inserted between the pseudorandom number generating device 11 and input switchover device 13. The instruction converting device 15 is configured in such manner as outputting the pseudorandom numbers inputted from the pseudorandom number generating device 11 without change when the inputted pseudorandom numbers are defined instructions and converting, when the inputted pseudorandom numbers are undefined instructions, the undefined instructions into the defined instructions to thereby output the defined instructions. Any other component in FIG. 2 is identical to those in FIG. 1 of the Embodiment 1, therefore the same reference numerals are simply appended to the components and the descriptions thereof are omitted.

In the test conducted in the manufacturing process, the input switchover device 13 is controlled by means of the switchover control signal 12 so that paths of the pseudorandom number generating device 11 and instruction converting device 15 are connected to the instruction register 14. When the pseudorandom numbers generated in the pseudorandom number generating device 11 are the defined instructions, the instruction converting device 15 inputs the defined instructions to the instruction register 14 via the input switchover device 13 without change. When the pseudorandom numbers are the undefined instructions, the instruction converting device 15 converts the undefined instructions into the defined instructions. The outputted defined instructions are inputted via the input switchover device 13 to the instruction register 14. As a result, the random defined instructions are inputted to the instruction register 14. The processor 10 operates based on the defined instructions inputted to the instruction register 14 and implements the data output 9. In brief, the defined instructions are randomly implemented. The data output 9 is compared to an expected value.

According to this embodiment, the defined instructions alone are inputted to the instruction register 14, which makes it unnecessary for the processor 10 to implement exception processing. As a result, the testing time can be reduced. Further, because the instructions are randomly implemented, the test in the manufacturing process can be implemented with the activation rate equivalent to the same in the normal operation.

Embodiment 3

Figure 3:
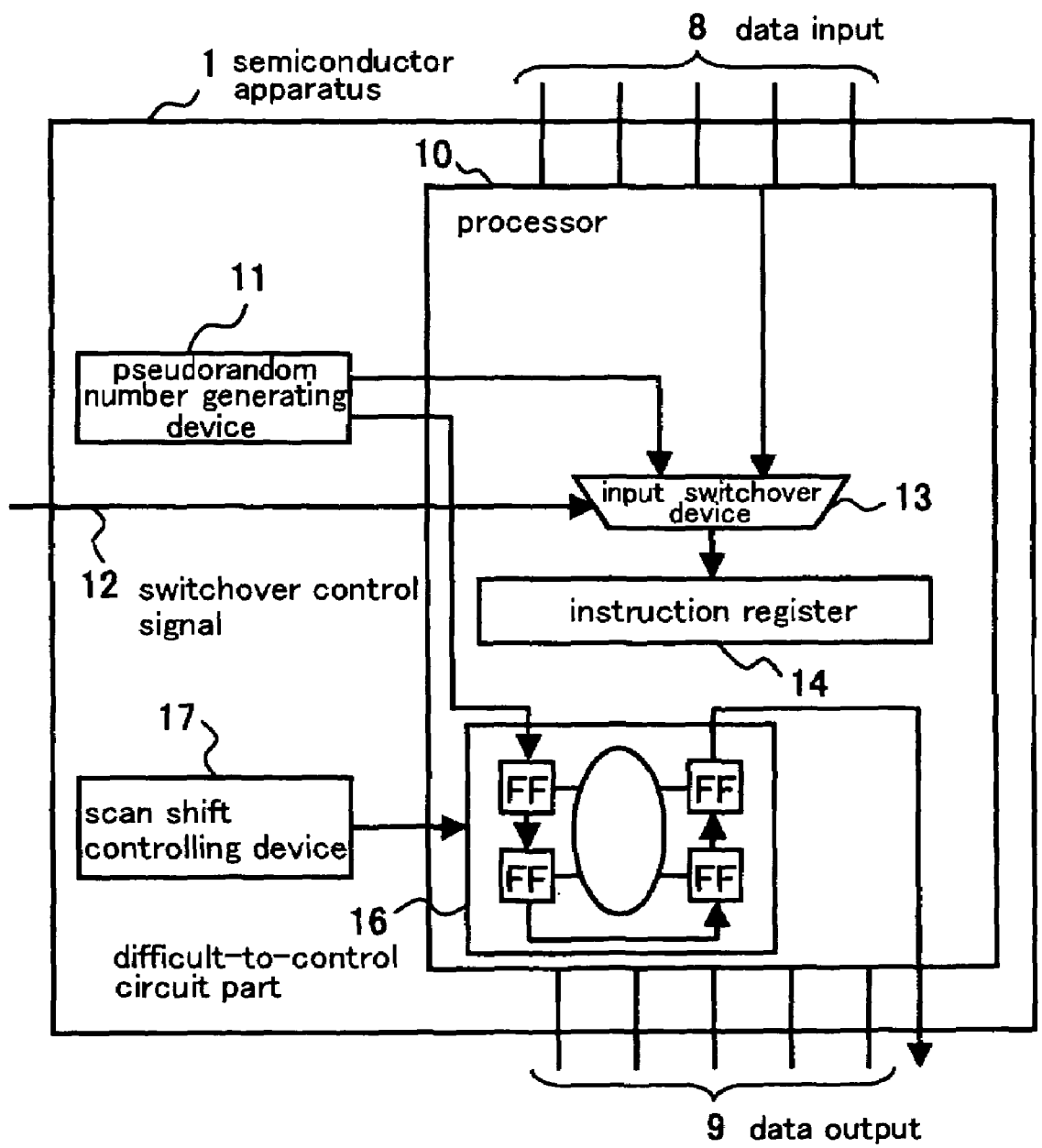
FIG. 3 is a block diagram illustrating the configuration of a semiconductor apparatus according to Embodiment 3 of the present invention.

The semiconductor apparatus according to Embodiment 3 of the present invention is described referring to FIG. 3.

In FIG. 3, a numeral 16 is a difficult-to-control circuit part constituting a circuit part difficult to control by means of the random instructions. A numeral 17 is a scan shift controlling device for controlling scan input and scan output of the pseudorandom numbers from the pseudorandom number generating device 11 with respect to flip-flops disposed in front and behind of a combining circuit in the difficult-to-control circuit part 16. Any other component in FIG. 3 is identical to those in FIG. 1 of the Embodiment 1, therefore the same reference numerals are simply appended to the components and the descriptions thereof are omitted.

In the test conducted in manufacturing process, the input switchover device 13 is controlled by means of the switchover control signal 12 so that the pseudorandom numbers generated in the pseudorandom number generating device 11 are directly inputted to the instruction register 14. The processor 10 operates the pseudorandom numbers inputted to the instruction register 14 as the instruction codes and implements the data output 9. The data output 9 is compared to an expected value.

In contrast to that, in the difficult-to-control circuit part, the pseudorandom numbers from the pseudorandom number generating device 11 are scan inputted to the flip-flops by means of the scan shift controlling device 17 to thereby detect faults.

According to this embodiment, the processor 10 implements the instructions based on the pseudorandom numbers to any component other than the difficult-to-control circuit part 16. Therefore, the test in the manufacturing process can be implemented with an activation rate equivalent to the same in the normal operation. A high fault detection rate is thus easily realized.

Embodiment 4

Figure 4:
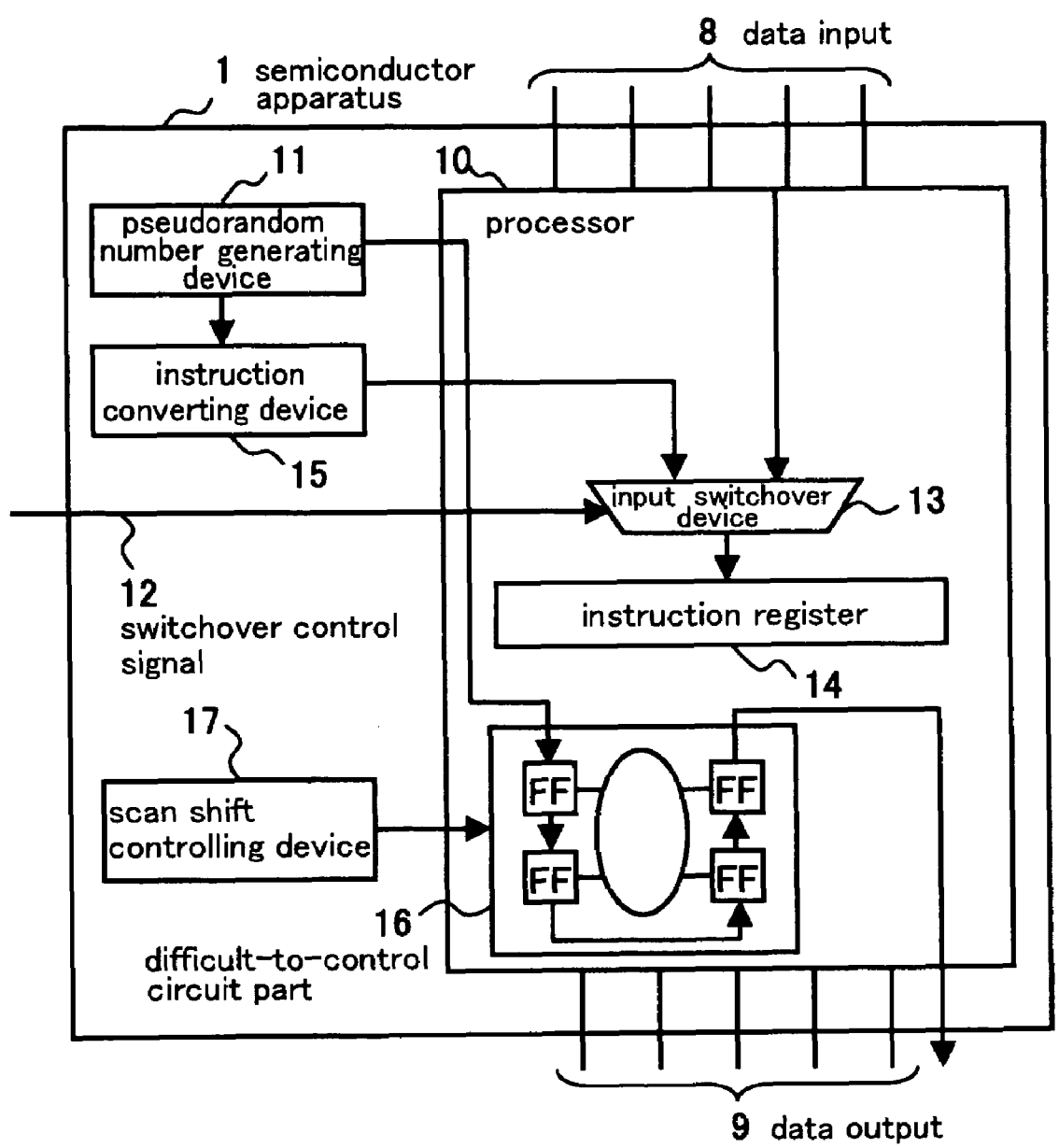
FIG. 4 is a block diagram illustrating the configuration of a semiconductor apparatus according to Embodiment 4 of the present invention.

The semiconductor apparatus according to Embodiment 4 of the present invention is described referring to FIG. 4.

The semiconductor apparatus 1 according to this embodiment constitutes the configuration shown in FIG. 3 of the Embodiment 3 with the instruction converting device 15 as in the Embodiment 2 further provided therein. That means that the instruction converting device 15 is configured in such manner as being inserted between the pseudorandom number generating device 11 and input switchover device 13 and, when the pseudorandom numbers inputted from the pseudorandom number generating device 11 are the defined instructions, outputting the inputted pseudorandom numbers without change, while, when the inputted pseudorandom numbers are the undefined instructions, converting the undefined instructions into the defined instructions to thereby output the defined instructions. Any other component in FIG. 4 is identical to those in FIG. 3 of the Embodiment 3, therefore the same reference numerals are simply appended to the components and the descriptions thereof are omitted.

In the test conducted in the manufacturing process, the input switchover device 13 is controlled by means of the switchover control signal 12 so that the paths of the pseudorandom number generating device 11 and instruction converting device 15 are connected to the instruction register 14. When the pseudorandom numbers generated in the pseudorandom number generating device 11 are the defined instructions, the instruction converting device 15 inputs the defined instructions to the instruction register 14 via the input switchover device 13 without change. When the pseudorandom numbers are the undefined instructions, the instruction converting device 15 converts the undefined instructions into the defined instructions, which are outputted and inputted via the input switchover device 13 to the instruction register 14. As a result, the random defined instructions are constantly inputted to the instruction register 14. The processor 10 operates based on the defined instructions inputted to the instruction register 14 and implements the data output 9. In brief, the defined instructions are randomly implemented. The data output 9 is compared to an expected value.

In contrast to that, in the difficult-to-control circuit part 16, the pseudorandom numbers from the pseudorandom number generating device 11 are scan inputted to the flip-flops by means of the scan shift controlling device 17 to thereby detect the faults.

According to this embodiment, with exception of the difficult-to-control circuit part 16, the defined instructions alone are inputted to the instruction register 14, which makes it unnecessary for the processor 10 to implement the exception processing. As a result, the testing time can be reduced. Further, because the defined instructions are randomly implemented, the test in the manufacturing process can be implemented with an activation rate equivalent to the same in the normal operation. A high fault detection rate can be thus easily realized.

Embodiment 5

The semiconductor apparatus according to Embodiment 5 of the present invention is described referring to FIG. 5.

The semiconductor apparatus 1 according to this embodiment constitutes the configuration shown in FIG. 1 of the Embodiment 1 with a store instruction issuing device 18 and input switchover device 19 further provided therein. The store instruction issuing device 18 periodically issues store instructions instructing values in an internal register (not shown) to be stored outside. The front input switchover device 19 is configured in such manner as switching over between the pseudorandom number generating device 11 and store instruction issuing device 18 to thereby output the pseudorandom numbers or store instructions to the rear input switchover device 13. More specifically, the front input switchover device 19 is configured in such manner as being capable of inputting the pseudorandom numbers or store instructions to the instruction register 14 inside the processor 10. The front input switchover device 19 is comprised of, for example, a selector as in the case of the rear input switchover device 13. Any other component in FIG. 5 is identical to those in FIG. 1 of the Embodiment 1, therefore the same reference numerals are simply appended to the components and the descriptions thereof are omitted.

In the test conducted in the manufacturing process, the rear input switchover device 13 is controlled by means of the switchover control signal 12 so that the front input switchover device 19 is selected. The front input switchover device 19 periodically switches over between the pseudorandom number generating device 11 and store instruction issuing device 18. In this manner, the pseudorandom numbers generated in the pseudorandom number generating device 11 or the store instructions outputted from the store instruction issuing device 18 are inputted to the instruction register 14 via the rear input switchover device 13. As a result, the pseudorandom numbers or store instructions are inputted to the instruction register 14. More specifically, the store instructions are periodically implemented while the instructions are randomly implemented. The processor 10 operates the pseudorandom numbers inputted to the instruction register 14 as the instruction codes and implements the data output 9. The data output 9 is compared to an expected value, and the values in the internal register are periodically observed in response to the store instructions.

According to this embodiment, because the instructions implemented by the processor 10 stand on the pseudorandom numbers, the test in the manufacturing process can be implemented with an activation rate equivalent to the same in the normal operation. Further, the test can be efficiently implemented because the values in the internal register are periodically observed.

Embodiment 6

Figure 6:
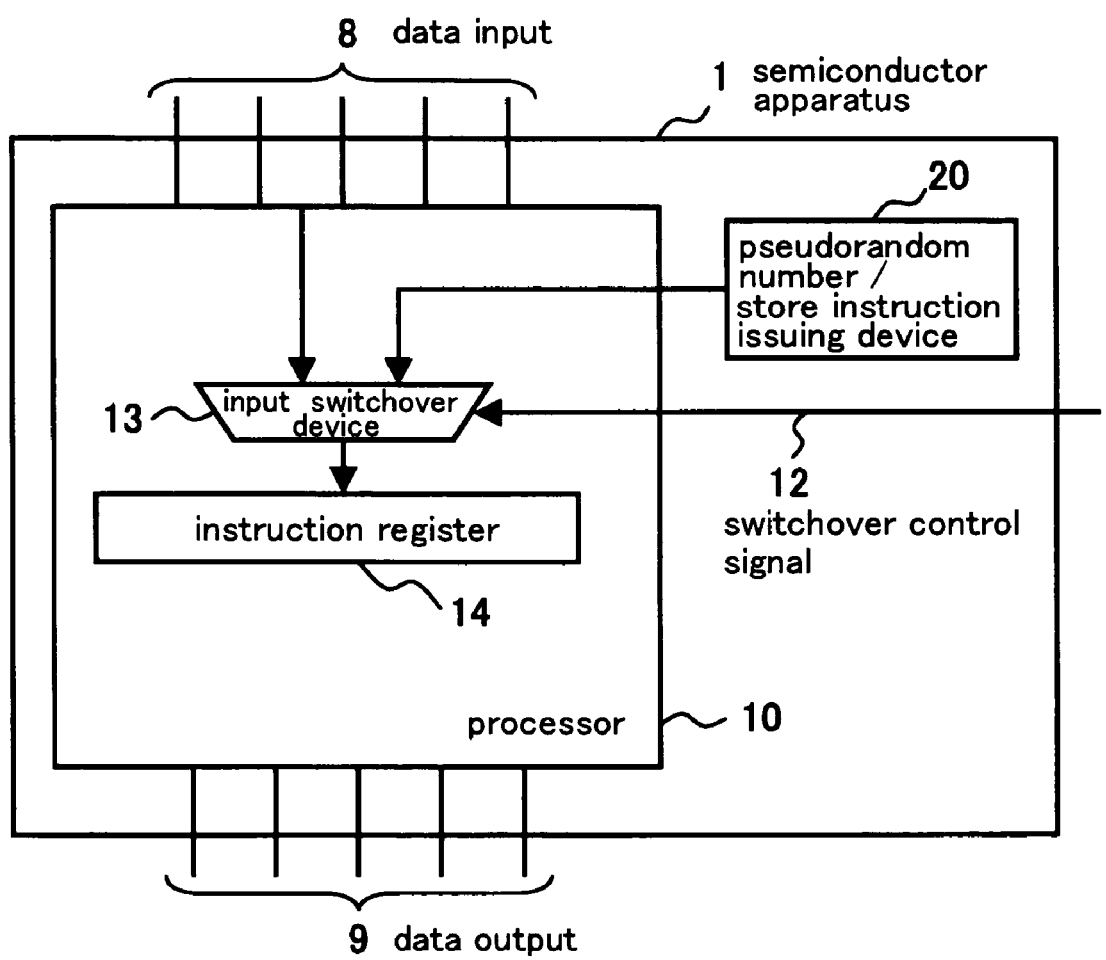
FIG. 6 is a block diagram illustrating the configuration of a semiconductor apparatus according to Embodiment 6 of the present invention.

The semiconductor apparatus according to Embodiment 6 of the present invention is described referring to FIG. 6.

The semiconductor apparatus 1 according to this embodiment constitutes the configuration shown in FIG. 1 of the Embodiment 1 with a pseudorandom number/store instruction issuing device 20, in place of the pseudorandom number generating device 11, further provided therein. The pseudorandom number/store instruction issuing device 20 periodically switches over between the pseudorandom numbers and store instructions for outside from the internal register and outputs the pseudorandom numbers or store instructions. More specifically, the pseudorandom number/store instruction issuing device 20 is configured in such manner as being capable of inputting the pseudorandom numbers or store instructions to the instruction register 14 inside of the processor 10. Any other component in FIG. 6 is identical to those in FIG. 1 of the Embodiment 1, therefore the same reference numerals are simply appended to the components and the descriptions thereof are omitted.

In the test conducted in the manufacturing process, the input switchover device 13 is controlled by means of the switchover control signal 12 so that the pseudorandom numbers or store instructions generated in the pseudorandom number/store instruction generating device 20 are inputted to the instruction register 14 via the input switchover device 13. In this manner, the pseudorandom numbers or store instructions are inputted to the instruction register 14. That means that the store instructions are periodically implemented while the instructions are randomly implemented. The data output 9, which results from the input of the pseudorandom numbers generated in the pseudorandom number/store instruction generating device 20 to the instruction register 14, is compared to an expected value.

According to this embodiment, because the instructions implemented by the processor 10 stand on the pseudorandom numbers, the test in the manufacturing process can be implemented with an activation rate equivalent to the same in the normal operation. Further, because of the periodical observation of the values in the internal register, the test can be efficiently implemented.

Embodiment 7

Figure 7:
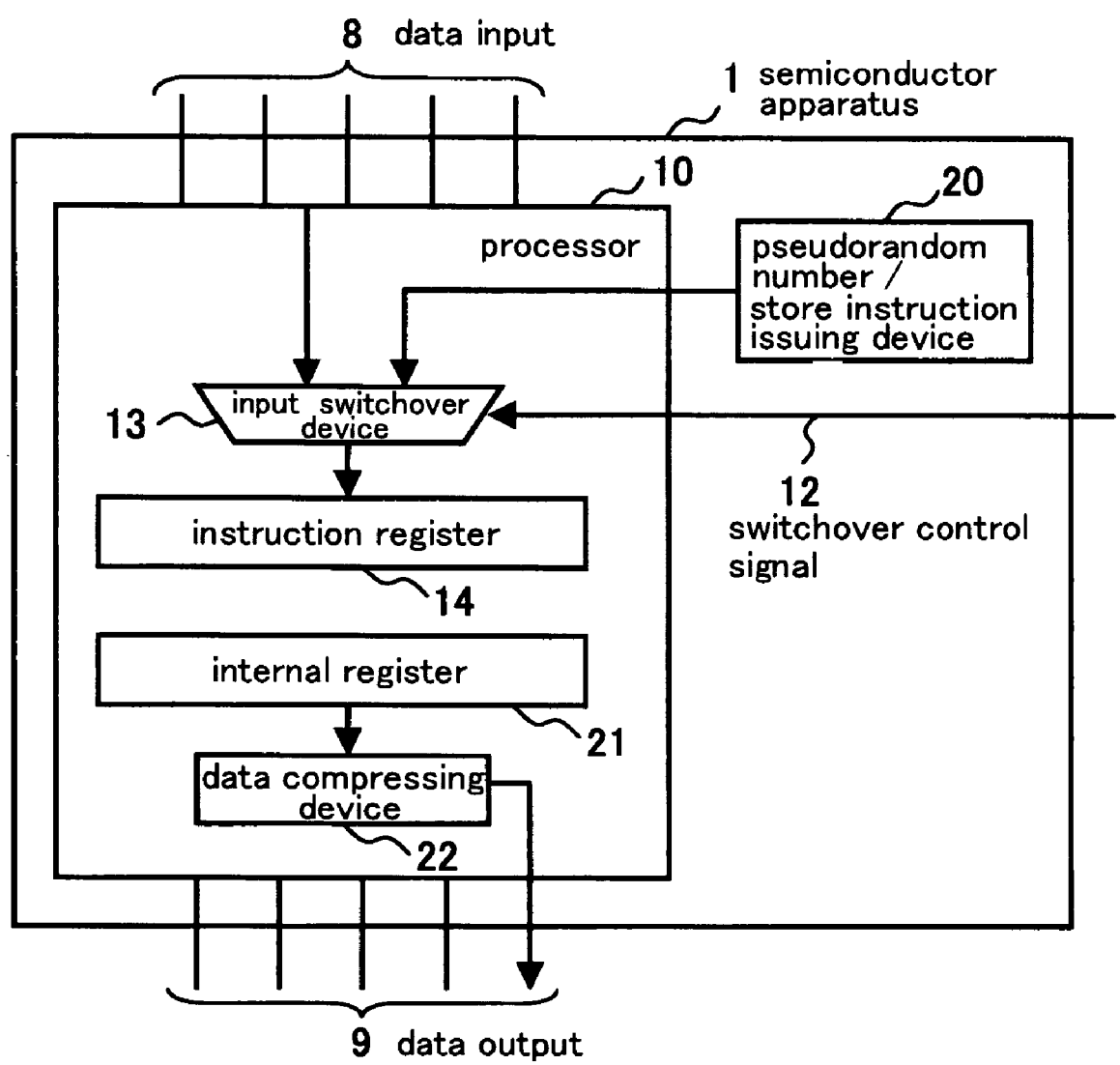
FIG. 7 is a block diagram illustrating the configuration of a semiconductor apparatus according to Embodiment 7 of the present invention.
Figure 8:
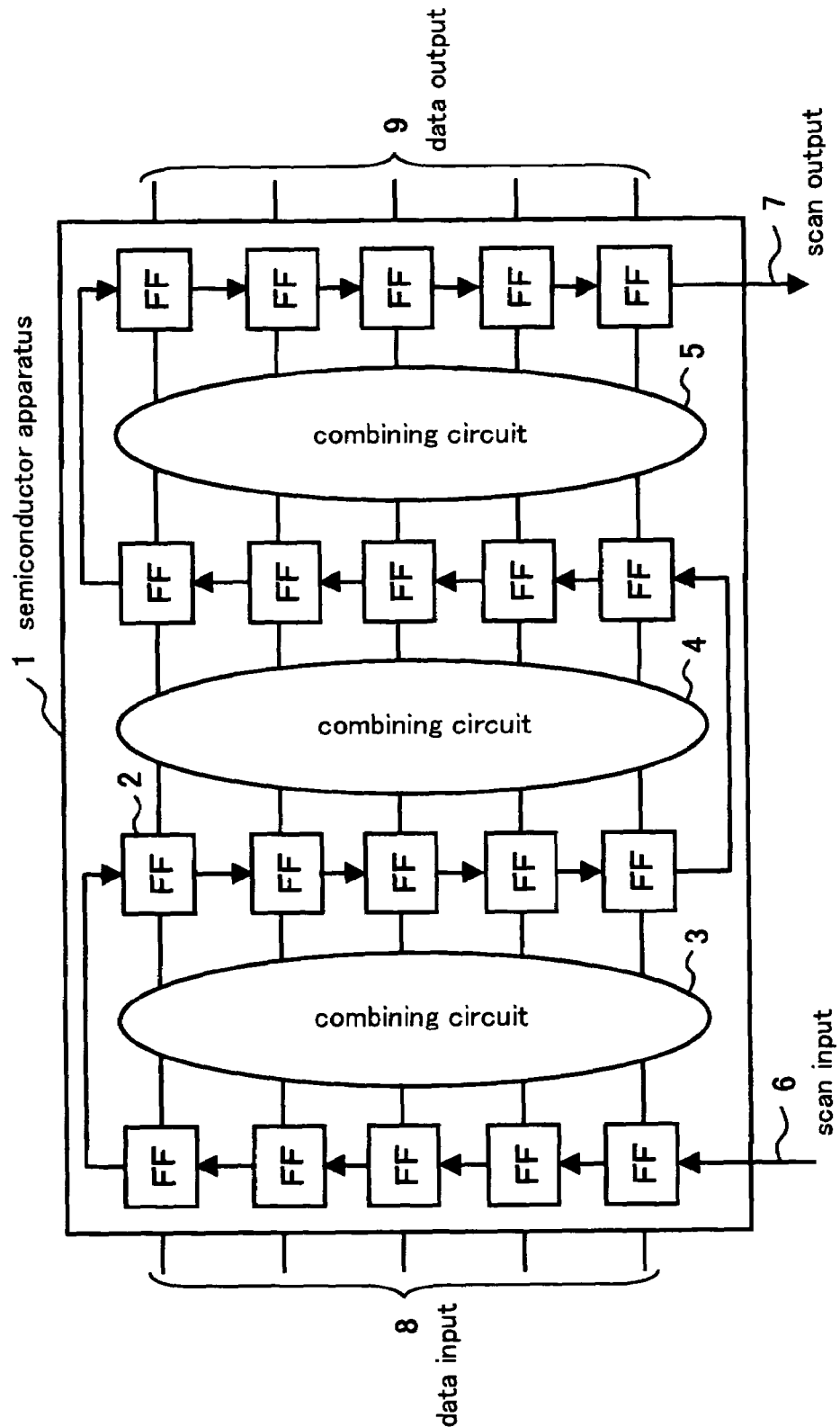
FIG. 8 is a block diagram illustrating the configuration of a semiconductor apparatus according to a conventional technology.

The semiconductor apparatus according to Embodiment 7 of the present invention is described referring to FIG. 7.

The semiconductor apparatus 1 according to this embodiment constitutes the configuration shown in FIG. 6 of the Embodiment 6 with a data compressing device 22 for compressing values in internal registers 21 further provided therein. Any other component in FIG. 7 is identical to those in FIG. 6 of the Embodiment 6, therefore the same reference numerals are simply appended to the components and the descriptions thereof are omitted In the test conducted in the manufacturing process, the input switchover device 13 is controlled by means of the switchover control signal 12 so that the pseudorandom numbers or store instructions generated in the pseudorandom number/store instruction generating device 20 are inputted via the input switchover device 13 to the instruction register 14. In this manner, the pseudorandom numbers or store instructions are inputted to the instruction register 14. That means that the store instructions are periodically implemented while the instructions are randomly implemented. The data output 9, which results from the input of the pseudorandom numbers generated in the pseudorandom number/store instruction generating device 20 to the instruction register 14, is compared to an expected value.

Because a plurality of the internal registers 21 is provided, it is generally necessary to implement the store instructions plural times in order to store the values in all the internal registers 21. In contrast to that, the semiconductor apparatus 1 according to this embodiment comprises the data compressing device 22 as described so that the values in the internal registers 21 in accordance with the plural input patterns are compressed by the data compressing device 22 to thereby combine the respective output results per pattern with the compressed values of the internal registers 21 and output the combined result in response to one store instruction. The fault detection and observation of the internal registers 21 are thereby implemented.

According to this embodiment, because the instructions implemented by the processor 10 stand on the pseudorandom numbers, the test in the manufacturing process can be implemented with an activation rate equivalent to the same in the normal operation. Further, because the values in the plural internal registers are periodically and collectively observed, the test can be more efficiently implemented.

From the above description, it will be apparent what the present invention provides.

What is claimed is:

1. A semiconductor apparatus comprising:
   a processor having an instruction register and an input switchover device;
   a pseudorandom number generating device for generating pseudorandom numbers; and
   an instruction converting device between the pseudorandom number generating device and input switchover device, outputting the pseudorandom numbers without change when the pseudorandom numbers inputted from the pseudorandom number generating device are defined instructions, and converting the pseudorandom numbers into the defined instructions when the pseudorandom numbers are undefined instructions to thereby output the defined instructions, wherein:
   the input switchover device switches over between data input in normal operation and input of the pseudorandom numbers from the pseudorandom number generating device in the test operation to thereby output the pseudorandom numbers in the test operation to the instruction register, and
   the processor operates on the pseudorandom numbers inputted to the instruction register in the test operation.

2. A semiconductor apparatus comprising:
   a processor having an instruction register, an input switchover device, and a difficult-to-control circuit part difficult to control by merely setting pseudorandom numbers in the instruction register;
   a pseudorandom number generating device generating pseudorandom numbers;
   a scan shift controlling device inputting the pseudorandom numbers from the pseudorandom number generating device to the difficult-to-control circuit part in the test operation, and outputting data from the difficult-to-control circuit part; and
   an instruction converting device between the pseudorandom number generating device and input switchover device outputting the pseudorandom numbers without change when the pseudorandom numbers inputted from the pseudorandom number generating device are defined instructions, and converting the pseudorandom numbers into the defined instructions when the pseudorandom numbers are undefined instructions to thereby output the defined instructions, wherein:
   the input switchover device switches over between data input in normal operation and input of the pseudorandom numbers from the pseudorandom number generating device in the test operation to thereby output the pseudorandom numbers in the test operation to the instruction register, and
   the processor operates on the pseudorandom numbers inputted to the instruction register in the test operation.

* * * * *